(12) United States Patent
Nakashima et al.

(10) Patent No.: US 12,172,408 B2
(45) Date of Patent: Dec. 24, 2024

(54) METAL CLAD LAMINATE AND PRODUCTION METHOD THEREOF

(71) Applicant: Kuraray Co., Ltd., Kurashiki (JP)

(72) Inventors: Takahiro Nakashima, Kamisu (JP); Takeshi Takahashi, Kamisu (JP); Masataka Shintani, Kurashiki (JP); Minoru Onodera, Kurashiki (JP)

(73) Assignee: Kuraray Co., Ltd., Kurashiki (JP)

( * ) Notice: Subject to any disclaimer, the term of this patent is extended or adjusted under 35 U.S.C. 154(b) by 619 days.

(21) Appl. No.: 16/592,823

(22) Filed: Oct. 4, 2019

(65) Prior Publication Data

US 2020/0031098 A1 Jan. 30, 2020

Related U.S. Application Data

(63) Continuation of application No. PCT/JP2018/012222, filed on Mar. 26, 2018.

(30) Foreign Application Priority Data

Apr. 7, 2017 (JP) ................................. 2017-076564

(51) Int. Cl.
*B32B 15/08* (2006.01)
*B29C 65/00* (2006.01)
(Continued)

(52) U.S. Cl.
CPC ............ *B32B 15/08* (2013.01); *B29C 66/742* (2013.01); *B32B 15/09* (2013.01); *B32B 37/06* (2013.01);
(Continued)

(58) Field of Classification Search
CPC ..... B32B 15/08; B32B 15/082; B32B 15/088; B32B 15/09; B32B 2307/406;
(Continued)

(56) References Cited

U.S. PATENT DOCUMENTS 5,843,562 A * 12/1998 Onodera ............... B29C 59/022
428/338
6,616,796 B1 9/2003 Onodera et al.
(Continued)

FOREIGN PATENT DOCUMENTS

CN 1929994 A * 3/2007 ............. B32B 15/08
CN 101056758 A * 10/2007 ............. B29C 65/02
(Continued)

OTHER PUBLICATIONS

Machine translation of JP2015-032605A, published Feb. 16, 2015, Powered by EPO and Google. (Year: 2015).*
(Continued)

*Primary Examiner* — Monique R Jackson
(74) *Attorney, Agent, or Firm* — Oblon, McClelland, Maier & Neustadt, L.L.P.

(57) ABSTRACT

Provided are a metal clad laminate and a method for producing the same. The metal clad laminate at least includes a thermoplastic liquid crystal polymer film and a metal sheet bonded to each other, wherein the thermoplastic liquid crystal polymer film has a surface with a glossiness (20°) of 55 or higher in accordance with JIS Z 8741 on the opposite side of the bonding surface to the metal sheet. The method for producing a metal clad laminate at least includes: providing a thermoplastic liquid crystal polymer film 2 and a metal sheet 6; and introducing the thermoplastic liquid crystal polymer film 2 and the metal sheet 6 between a pair of heating rolls so as to laminate them.

14 Claims, 1 Drawing Sheet

(51) Int. Cl.
  *B32B 15/09* (2006.01)
  *B32B 37/06* (2006.01)
  *B32B 37/10* (2006.01)
  *H05K 1/03* (2006.01)

(52) U.S. Cl.
  CPC .............. *B32B 37/10* (2013.01); *H05K 1/03* (2013.01); *B32B 2255/10* (2013.01); *B32B 2255/205* (2013.01); *B32B 2305/55* (2013.01); *B32B 2307/30* (2013.01); *B32B 2307/406* (2013.01); *B32B 2307/538* (2013.01); *B32B 2307/732* (2013.01); *B32B 2457/08* (2013.01); *H05K 2201/0141* (2013.01)

(58) Field of Classification Search
  CPC ............. B32B 2255/10; B32B 2255/205; H05K 1/03; H05K 2201/0141; H05K 2201/0358; C23C 14/20; C23C 14/205
  See application file for complete search history.

(56) References Cited

U.S. PATENT DOCUMENTS

| | | | | |
|---|---|---|---|---|
| 7,811,408 | B2 * | 10/2010 | Onodera | H05K 3/0011 |
| | | | | 156/308.2 |
| 9,096,049 | B2 * | 8/2015 | Onodera | B29C 66/9141 |
| 10,329,394 | B2 | 6/2019 | Kodera et al. | |
| 2007/0169886 | A1 * | 7/2007 | Watanabe | B32B 15/20 |
| | | | | 428/411.1 |
| 2008/0107833 | A1 * | 5/2008 | Onodera | B29C 66/91933 |
| | | | | 156/324 |
| 2009/0200263 | A1 * | 8/2009 | Piel | H05K 3/381 |
| | | | | 216/13 |
| 2009/0246483 | A1 | 10/2009 | Sugimura | |
| 2010/0323210 | A1 * | 12/2010 | Onodera | B29C 66/91933 |
| | | | | 428/457 |
| 2012/0025132 | A1 * | 2/2012 | Asahi | C08G 59/64 |
| | | | | 252/76 |
| 2013/0069001 | A1 * | 3/2013 | Luo | C08L 81/02 |
| | | | | 252/299.5 |
| 2014/0355229 | A1 | 12/2014 | Arai et al. | |
| 2016/0303629 | A1 | 10/2016 | Arai et al. | |
| 2017/0318670 | A1 * | 11/2017 | Tachibana | B32B 27/42 |
| 2018/0030223 | A1 | 2/2018 | Kodera et al. | |
| 2020/0290315 | A1 * | 9/2020 | Hiramatsu | C25D 3/38 |

FOREIGN PATENT DOCUMENTS

| | | | | |
|---|---|---|---|---|
| CN | 102673063 A | * | 9/2012 | |
| EP | 3 424 703 A1 | | 1/2019 | |
| JP | 04-226350 A | | 8/1992 | |
| JP | 2000-343610 A | | 12/2000 | |
| JP | 2001239585 A | * | 9/2001 | |
| JP | 2002-019023 A | | 1/2002 | |
| JP | 2014-128913 A | | 7/2014 | |
| JP | 2015-032605 A | | 2/2015 | |
| JP | 2015-61756 A | | 4/2015 | |
| JP | 2016-107505 A | | 6/2016 | |
| JP | 2017-039992 A | | 2/2017 | |
| TW | 200600323 A | | 1/2006 | |
| TW | 200613140 A | | 5/2006 | |
| TW | 200621 480 A | | 7/2006 | |
| TW | 201441002 A | | 11/2014 | |
| TW | 201609884 A | | 3/2016 | |
| WO | WO-2016114262 A1 | * | 7/2016 | ......... B29C 48/9145 |
| WO | WO 2016/139950 A1 | | 9/2016 | |
| WO | WO-2017150678 A1 | * | 9/2017 | ........... B32B 15/043 |

OTHER PUBLICATIONS

Extended European Search Report issued Nov. 6, 2020, in European Patent Application No. 18781636.8, 6 pages as provided by Applicant with the IDS filed Jan. 29, 2021. (Year: 2020).*
Combined Chinese Office Action and Search Report issued Dec. 3, 2020, in Chinese Patent Application No. 201880022652.1, 13 pages as provided by Applicant with the IDS filed Jan. 29, 2021. (Year: 2020).*
Notice to Grant issued Aug. 18, 2021 in Chinese Patent Application No. 201880022652.1 (with unedited computer generated English translation), 5 pages.
International Search Report issued Jun. 26, 2018 in PCT/JP2018/012222 filed on Mar. 26, 2018 (with English Translation).
Notice of Reasons for Refusal issued Feb. 8, 2022 in Japanese Patent Application No. 2019-511164 (with English machine translation), 10 pages.
Combined Taiwanese Office Action and Search Report issued Feb. 10, 2022 in Patent Application No. 107111586 (with English machine translation), 21 pages.
European Office Action issued May 30, 2022 in European Patent Application No. 18781636.8, 5 pages.
Korean Office Action issued Jun. 30, 2022 in Korean Patent Application No. 10-2019-7029166 (with unedited computer generated English translation), 10 pages.

* cited by examiner

METAL CLAD LAMINATE AND PRODUCTION METHOD THEREOF

CROSS REFERENCE TO THE RELAYED APPLICATION

This application is a continuation application, under 35 U.S.C § 111(a) of international application No. PCT/JP2018/012222, filed Mar. 26, 2018, which claims priority to Japanese patent application No. 2017-076564, filed Apr. 7, 2017, the entire disclosure of which is herein incorporated by reference as a part of this application.

FIELD OF THE INVENTION

The present invention relates to a metal clad laminate comprising a thermoplastic liquid crystal polymer film and a metal layer as well as to a method for producing the same.

BACKGROUND OF THE INVENTION

Conventionally, metal clad laminates including thermoplastic liquid crystal polymer films have been used as a material for circuit boards, such as flexible wiring boards and circuit boards for semi-conductor implementation because they are excellent in low hygroscopicity, heat resistance, chemical resistance and electrical properties as well as excellent in dimensional stability thanks to the thermoplastic liquid crystal polymer films.

In particular, there is an increasing demand for single-sided metal clad laminates having metal sheets laminated on single sides of thermoplastic liquid crystal polymer films to be used in the form of, for example, microstrip circuits subjected to circuit forming process on the film surfaces which are not laminated with a metal sheet.

For example, Patent Document 1 (JP Laid-open Patent Publication No. 2000-343610) describes a single-sided metal clad laminate formed by roll bonding of a thermoplastic liquid crystal polymer film and a metal sheet. This document describes that a pair of a heat-resistant rubber roll and a metal heating roll are used when a single-sided metal clad laminate is formed by laminating a thermoplastic liquid crystal polymer film and a metal sheet.

CONVENTIONAL ART DOCUMENT

Patent Document

[Patent Document 1] JP Laid-open Patent Publication No. 2000-343610

SUMMARY OF THE INVENTION

Problems to be Solved by the Invention

In the single-sided metal clad laminate obtained by Patent Document 1, a thermoplastic liquid crystal polymer film and a metal sheet can be uniformly laminated using a heat-resistant rubber roll as a heating roll because the heat-resistant rubber roll follows unevenness on the film. Consequently, it is possible to improve adhesion strength between the thermoplastic liquid crystal polymer film and the metal sheet as well as dimensional stability.

On the other hand, lamination process of a highly heat-resistant film such as a thermoplastic liquid crystal polymer film requires lamination temperature of 260° C. or higher. Thus, in the case where a rubber roll is used, lamination process using the rubber roll for an extended period of time causes overheat of the rubber roll beyond the heat resistance thereof. Use of the overheated rubber roll results in reduced releasability of the rubber surface from the film and thus causes inferior appearance on the film surface due to deteriorated release.

Further, the single-sided metal clad laminate obtained by Patent Document 1 does not necessarily sufficiently achieve transmission properties required for precise circuit patterns, such as microstrip circuits, with rising demand in recent years.

An object of the present invention is to provide a metal clad laminate having improved surface smoothness on a surface of a thermoplastic liquid crystal polymer film.

Another object of the present invention is to provide a metal clad laminate capable of achieving good transmission properties.

Still another object of the present invention is to provide a method for efficiently producing a metal clad laminate that has an excellent smoothness on a thermoplastic liquid crystal polymer film surface even when the laminate is continuously manufactured for an extended period of time via a roll-to-roll processing.

Means for Solving the Problems

As a result of intensive studies to achieve the above objects, the inventors of the present invention firstly have found that (1) when forming circuit patterns such as microstrips and strip lines, it is advantageous to form a transmission line by vapor deposition and/or conductive paste etc. on a film surface of a single-sided metal clad laminate comprising a metal sheet and the film, and that in order to further improve transmission properties the surface condition of the film surface of the single-sided metal clad laminate exerts a great influence on circuit properties such as transmission properties. In addition, the inventors noticed that (2) although it has been difficult to evaluate surface condition of entire films by the conventional surface roughness evaluation, in thermoplastic liquid crystal polymer films having non-metallic luster surfaces, use of glossiness as an indicator makes it possible to accurately evaluate the surface condition of the entire films that affects transmission properties. By conducting further studies, the inventors have further found that (3) instead of a rubber roll with which a thermoplastic liquid crystal polymer film comes into contact, use of a metal elastic roll (an elastic roll having a metal surface) having surface-attaching property as well as a predetermined surface roughness makes it possible to transfer smoothness of the metal elastic roll onto the surface of the thermoplastic liquid crystal polymer film and thereby to impart a specific glossiness to the surface of the liquid crystal polymer film; that (4) a metal clad laminate having such glossiness on a surface of the liquid crystal polymer film makes it possible to form a circuit pattern having excellent transmission properties; and that (5) where such a metal elastic roll is used, inferior appearance on the surface of the thermoplastic liquid crystal polymer film due to deteriorated release can be effectively prevented by virtue of surface durability and releasability of the metal elastic roll from the film, even when the laminate is continuously manufactured for an extended period of time via a roll-to-roll processing. In the light of the above findings, the inventors achieved the present invention.

Accordingly, the present invention may include the following aspects.

Aspect 1

A metal clad laminate at least including a thermoplastic liquid crystal polymer film and a metal sheet bonded to each other, wherein the thermoplastic liquid crystal polymer film has a surface with a glossiness (20°) of 55 or higher (preferably 60 or higher, more preferably 65 or higher) in accordance with JIS Z 8741 on the opposite side of the bonding surface to the metal sheet.

Aspect 2

The metal clad laminate according to Aspect 1, wherein the thermoplastic liquid crystal polymer film has a melting point of 290° C. or higher (preferably from 300° C. to 400° C., more preferably from 315° C. to 380° C.).

Aspect 3

The metal clad laminate according to Aspect 1 or 2, further including a metal vapor deposition layer formed on the surface of the thermoplastic liquid crystal polymer.

Aspect 4

The metal clad laminate according to any one of Aspects 1 to 3, wherein the metal clad laminate has a length of 100 m or longer in a longitudinal direction.

Aspect 5

A method for producing a metal clad laminate including a thermoplastic liquid crystal polymer film and a metal sheet bonded to a surface of the thermoplastic liquid crystal polymer film via a roll-to-roll processing, the method at least including: providing a thermoplastic liquid crystal polymer film and a metal sheet; and introducing the thermoplastic liquid crystal polymer film and the metal sheet between a pair of heating rolls so as to laminate the thermoplastic liquid crystal polymer film and the metal sheet between the pair of heating roll, wherein the pair of heating rolls at least include a metal elastic roll on a side that comes into contact with the thermoplastic liquid crystal polymer film, and the metal elastic roll surface has a ten-point average roughness Rz of 0.2 μm or lower (for example, 0.01 to 0.2 μm).

Aspect 6

The method for producing a metal clad laminate according to Aspect 5, wherein the pair of heating rolls include a metal roll and a metal elastic roll.

Aspect 7

The method for producing a metal clad laminate according to Aspect 6, wherein the metal roll is an internal heating metal roll.

Aspect 8

The method for producing a metal clad laminate according to any one of Aspects 5 to 7, wherein the metal elastic roll is constituted from a roll of heat-resistant rubber and a metal surface layer formed around the roll.

Aspect 9

The method for producing a metal clad laminate according to Aspect 8, wherein the heat-resistant rubber has a hardness from 70 to 100, and the metal surface layer has a thickness from 100 to 1000 μm.

Aspect 10

A circuit board including a metal clad laminate according to any one of Aspects 1 to 4 and a circuit pattern formed on the metal clad laminate.

Aspect 11

The circuit board according to Aspect 10, wherein the circuit pattern is formed on a surface of the thermoplastic liquid crystal polymer film or on a surface of the metal vapor deposition layer.

The present invention encompasses any combination of at least two features disclosed in the claims and/or the specification and/or the drawings. In particular, any combination of two or more of the appended claims should be equally construed as included within the scope of the present invention.

The metal clad laminate according to the present invention includes a thermoplastic liquid crystal polymer film having an extremely smooth surface and a specific glossiness. Thus, it is possible to take advantage of the smooth surface of the thermoplastic liquid crystal polymer film to form a precise circuit pattern that can be adapted to finely pitched circuit patterns. In addition, a circuit board exhibiting excellent transmission properties can be manufactured from such a metal clad laminate.

Further, use of a predetermined metal elastic roll in the present invention makes it possible to effectively manufacture the metal clad laminate via a roll-to-roll processing. In particular, this makes it possible not only to suppress inferior appearance of the thermoplastic liquid crystal polymer film caused by deteriorated release even when operation is performed for an extended period of time, but also to maintain predetermined glossiness on the surface of the thermoplastic liquid crystal polymer film.

BRIEF DESCRIPTION OF THE DRAWINGS

In any event, the present invention will be more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views. In the figures.

DESCRIPTION OF THE EMBODIMENTS

Method for Producing Metal Clad Laminate

An embodiment of the present invention is a method for producing a metal clad laminate comprising a thermoplastic liquid crystal polymer film and a metal sheet bonded to a surface of the thermoplastic liquid crystal polymer film via a roll-to-roll processing. The production method at least includes: providing a thermoplastic liquid crystal polymer film and a metal sheet; and introducing the thermoplastic liquid crystal polymer film and the metal sheet between a pair of heating rolls so as to laminate the thermoplastic liquid crystal polymer film and the metal sheet between the heating rolls.

Figure 1:
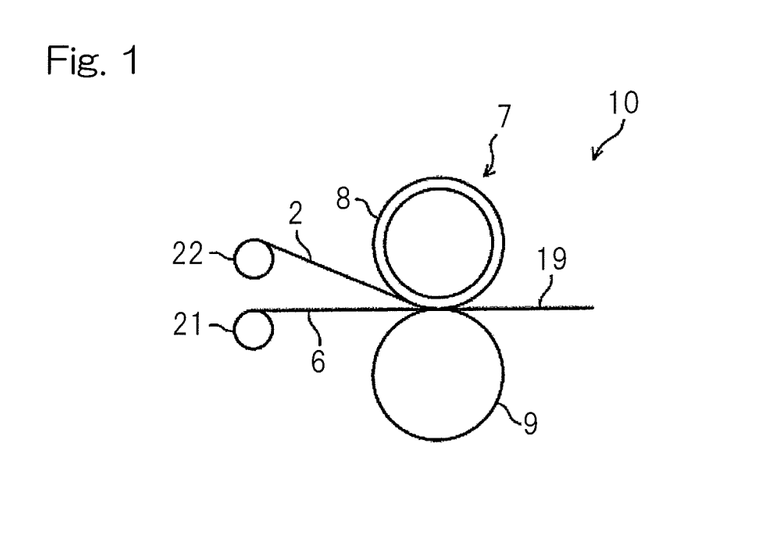
FIG. 1 is a schematic view illustrating a continuous hot press apparatus used in the production process of a metal clad laminate according to one embodiment of the present invention.

For example, FIG. 1 shows a continuous hot press apparatus 10 used in the production process of a metal clad laminate according to an embodiment of the present invention. The continuous hot press apparatus 10 has a pair of heating rolls 7 which at least include a metal elastic roll 8. In FIG. 1, the pair of heating rolls 7 comprises a metal elastic roll 8 and a metal heating roll 9. A thermoplastic liquid crystal polymer film 2 unwound from an unwinding roll 22 and a metal sheet 6 unwound from an unwinding roll 21 are introduced to the pair of heating rolls 7.

In the heating rolls 7, the thermoplastic liquid crystal polymer film 2 and the metal sheet 6 are thermocompression-bonded at a predetermined temperature and a pressure at a predetermined lamination speed in such a manner that the thermoplastic liquid crystal polymer film 2 is placed on the side of the metal elastic roll 8, and the metal sheet 6 is placed on the side of the metal heating roll 9 so as to form a single-sided metal clad laminate 19. The resultant single-sided metal clad laminate has a laminate structure in which the metal sheet layer and the thermoplastic liquid crystal polymer film layer are laminated in this order.

Figure 2:
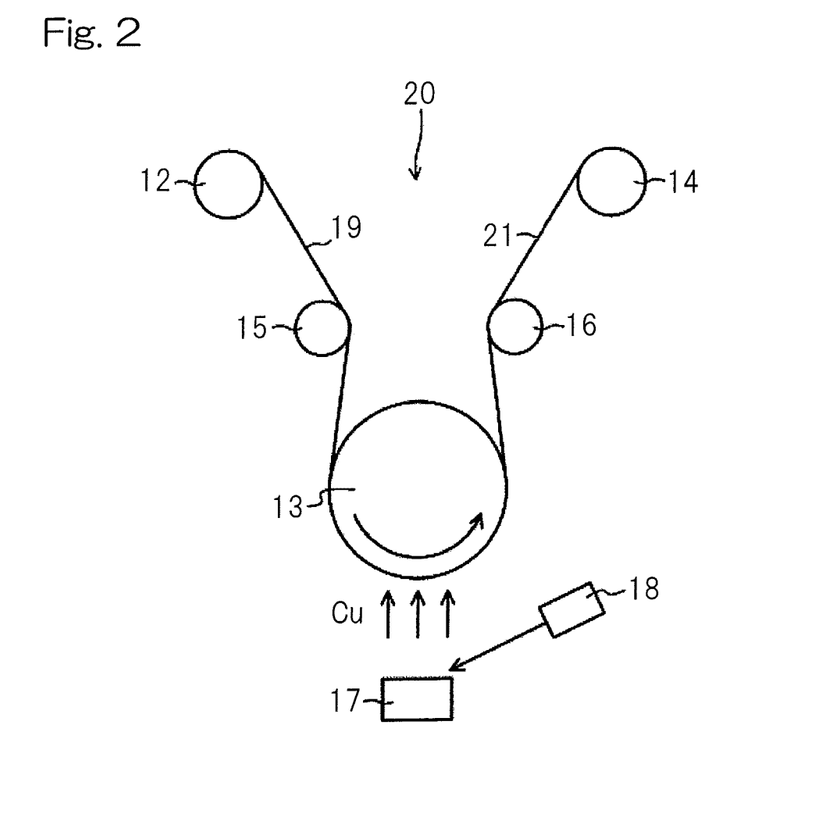
FIG. 2 is a schematic view illustrating a vapor deposition apparatus used in the production process of a metal clad laminate according to one embodiment of the present invention.

FIG. 2 shows a vapor deposition apparatus used in the production process of a metal clad laminate according to one embodiment of the present invention. As illustrated in FIG. 2, the obtained single-sided metal clad laminate 19 is introduced from an unwinding roll 12 using a guide roll 15 such that the surface of the metal sheet 6 in the single-sided metal clad laminate comes into contact with a heating roll 13 used in vapor deposition (hereinafter sometimes refers to as "vapor deposition-applied heating roll"). In other words, the liquid crystal polymer film 2 in the single-sided metal clad laminate does not come into contact with the vapor deposition-applied heating roll 13, but is introduced in such a way that the surface of the liquid crystal polymer film 2 is directed to the opposite side of the vapor deposition-applied heating roll 13. Thereafter, onto the single-sided metal clad laminate 19 introduced to the vapor deposition-applied heating roll 13, a metal vapor deposition layer (a copper vapor deposition layer) is formed on the liquid crystal polymer film 2 that is outward of the vapor deposition-applied heating roll 13. The formation of the metal vapor deposition layer is performed by irradiating an electron beam from an electron gun 18 onto a vapor deposition source-containing crucible 17 that is disposed below the vapor deposition-applied heating roll 13 to heat the vapor deposition source. Then the double-sided metal clad laminate 21 in which the metal vapor deposition layer is formed is guided by a guide roll 16 and is wound by a winding roll 14. The resultant double-sided metal clad laminate has a laminate structure in which the metal sheet layer, the thermoplastic liquid crystal polymer film layer, and the metal vapor deposition layer are laminated in this order.

Thermoplastic Liquid Crystal Polymer Film

The thermoplastic liquid crystal polymer film is formed from a liquid crystal polymer capable of being melt-molded. This thermoplastic liquid crystal polymer (hereinafter, sometimes simply referred to as "liquid crystal polymer") is not particularly limited for, in particular, its chemical structure as long as it is a melt-moldable liquid crystal polymer. Examples of the thermoplastic liquid crystal polymer may include a thermoplastic liquid crystal polyester or a thermoplastic liquid crystal polyester amide that is a polymer in which an amide bond is introduced to a thermoplastic liquid crystal polyester.

The thermoplastic liquid crystal polymer may also be a polymer in which, for example, an imide bond, a carbonate bond, a carbodiimide bond and/or a bond derived from an isocyanate, e.g., an isocyanurate bond are/is further introduced to an aromatic polyester or an aromatic polyester amide.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic dihydroxyl compounds (see Table 1 for representative examples)

TABLE 1

Chemical structural formulae of representative examples of aromatic or aliphatic dihydroxyl compounds X represents a hydrogen atom or a halogen atom, or a group such as a lower alkyl (e.g., $C_{1-3}$ alkyl) or a phenyl

TABLE 1-continued

Chemical structural formulae of representative examples of aromatic or aliphatic dihydroxyl compounds Y represents a group such
as —O—, —CH$_2$—, —S—, —CO—, —C(CH$_3$)$_2$—,
or —SO$_2$—

HO(CH$_2$)$_n$OH

$n$ is an integer of 2 to 12

(2) Aromatic or aliphatic dicarboxylic acids (see Table 2 for representative examples)

TABLE 2

Chemical structural formulae of representative examples of aromatic or aliphatic dicarboxylic acids

TABLE 2-continued

Chemical structural formulae of representative examples of aromatic or aliphatic dicarboxylic acids $n$ is an integer of 2 to 12

(3) Aromatic hydroxycarboxylic acids (see Table 3 for representative examples)

TABLE 3

Chemical structural formulae of representative examples of aromatic hydroxycarboxylic acids X represents a hydrogen atom or a halogen atom, or a group such as a lower alkyl (e.g., C$_{1-3}$ alkyl) or a phenyl

(4) Aromatic diamines, aromatic hydroxy amines, or aromatic aminocarboxylic acids (see Table 4 for representative examples)

TABLE 4

Chemical structural formulae of representative examples of aromatic diamines, aromatic hydroxy amines, or aromatic aminocarboxylic acids

Representative examples of liquid crystal polymers obtained from these raw-material compounds may include copolymers having structural units shown in Tables 5 and 6.

TABLE 5

Representative examples (1) of thermoplastic liquid crystal polymer

(A)    —[—OCH$_2$CH$_2$O—]—

(B)

(C)

(D)

(E)

(F)

Y is a group such as —O—, —S—, or —CH$_2$—

(G)

TABLE 5-continued

Representative examples (1) of thermoplastic liquid crystal polymer (H)

(I)

(H)

(I)

(J)

TABLE 6

Representative examples (2) of thermoplastic liquid crystal polymer (K)

(L)

TABLE 6-continued

Representative examples (2) of thermoplastic liquid crystal polymer

Y is a group such as —O—, —S—, or —CH$_2$—

Of these copolymers, polymers including at least p-hydroxybenzoic acid and/or 6-hydroxy-2-naphthoic acid as repeating units are preferable; and particularly preferred polymers include:

a polymer (i) having repeating units of p-hydroxybenzoic acid and 6-hydroxy-2-naphthoic acid, and a polymer (ii) having repeating units of
- at least one aromatic hydroxycarboxylic acid selected from a group consisting of p-hydroxybenzoic acid and 6-hydroxy-2-naphthoic acid,
- at least one aromatic diol selected from a group consisting of 4,4'-dihydroxybiphenyl and hydroquinone, and
- at least one aromatic dicarboxylic acid selected from a group consisting of terephthalic acid, isophthalic acid, and 2,6-naphthalene dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=15/85 to 85/15 (for example, 50/50 to 85/15), further preferably about (A)/(B)=20/80 to 80/20 (for example, 60/40 to 80/20).

Furthermore, in the case where the polymer (ii) comprises a liquid crystal polymer having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, and 2,6-naphthalene dicarboxylic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)=40 to 70:30 to 15:30 to 15.

Furthermore, the liquid crystal polymer may have a mole ratio of a repeating structural unit derived from an aromatic dicarboxylic acid relative to a repeating structural unit derived from an aromatic diol of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

Preferred thermoplastic liquid crystal polymer has a melting point (hereinafter, referred to as $M_0p$) in a range from 260° C. to 360° C., and more preferably from 270° C. to 350° C. A melting point $M_0p$ can be determined by measuring a temperature at which an endothermic peak occurs, using a differential scanning calorimeter (DSC produced by Shimadzu Corporation).

As long as the advantageous effect of the present invention is not deteriorated, the thermoplastic liquid crystal polymer may be added with any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine resin; and/or various additives. If necessary, a filler may be added to the thermoplastic liquid crystal polymer.

The thermoplastic liquid crystal polymer film used in the present invention can be obtained by extruding a thermoplastic liquid crystal polymer. As long as the direction of rigid rod-like molecules of the thermoplastic liquid crystal polymer can be controlled, any extrusion method may be applied. In particular, well-known methods such as a T-die method, a laminate-stretching method, and an inflation method are industrially advantageous. In particular, the inflation method or the laminate-stretching method can apply stresses not only in a machine processing direction of the film (hereinafter, referred to as MD direction), but also in a transverse direction (hereinafter, abbreviated as TD direction) perpendicular to the MD direction. Accordingly, the inflation method or the laminate-stretching method can be advantageously used to obtain a film having controlled dielectric characteristics in both the MD and TD directions.

If necessary, a known or conventional heat treatment may be carried out in order to control a melting point and/or thermal expansion coefficient of the thermoplastic liquid crystal polymer film. Heat treatment conditions can be set appropriately depending on the purpose. The heat treatment may be carried out by heating for hours at a temperature of, for example, $(M_0p-10)°$ C. or higher, wherein $M_0p$ denotes a melting point of a liquid crystal polymer, for example, about $(M_0p-10)°$ C. to $(M_0p+30)°$ C., preferably about $M_0p°$ C. to $(M_0p+20)°$ C. to increase a melting point (Tm) of the thermoplastic liquid crystal polymer film.

In view of desired heat resistance and processability of the film, the melting point (Tm) of the thermoplastic liquid crystal polymer film may be selected in a range from about 200° C. to 400° C., preferably about 250° C. to 360° C. and more preferably about 260° C. to 340° C.

The thermoplastic liquid crystal polymer film preferably has a higher isotropy. A segment orientation ratio SOR, i.e., an indicator of isotropy, may be 0.8 to 1.4, preferably 0.9 to 1.3, more preferably 1.0 to 1.2, and particularly preferably 1.0 to 1.1.

The segment orientation ratio SOR used herein refers to an indicator that indicates a degree of molecular orientation with respect to segments constituting a molecule, and it takes thickness of an object into consideration, as opposed to conventional MOR (Molecular Orientation Ratio).

In view of the application in the metal clad laminate, the thermoplastic liquid crystal polymer film used in the present invention may preferably have a film thickness in a range from 10 to 200 μm, more preferably in a range from 15 to 150 μm.

Metal Sheet

A metal sheet (hereinafter, sometimes referred to as metallic foil) is laminated on a single side of a thermoplastic liquid crystal polymer film in a metal clad laminate. Material of the metallic foil for the present invention is not particularly limited and may include, for example, copper, gold, silver, nickel, aluminum, stainless steel and others. In view of conductivity, handleability and cost, copper foil or stainless-steel foil may preferably be used, and, in particular, copper foil may preferably be used. Copper foil is not in specifically limited as long as the copper foil can be used for a circuit board and may be any of rolled copper foil and electrolyzed copper foil.

The metallic foil may also be subjected to chemical treatment such as pickling (acid cleaning) that is typically performed to copper foil. The metallic foil may preferably have a thickness in a range from 6 to 200 μm, more preferably from 9 to 40 μm, further preferably from 10 to 20

µm. This is because metallic foil with an excessively small thickness may cause deformation such as wrinkles during the production process of the metal clad laminate, while metallic foil with an excessively large thickness may have reduced bending performance when, for example, it is used for a flexible wiring board.

Ten-point average roughness Rz may, for example, be 0.1 µm or greater. In particular, ten-point average roughness of 2.0 µm or less makes it possible to obtain a metal clad laminate 1 having good high-frequency characteristics and excellent adhesion strength. In particular, to achieve a good balance between high-frequency characteristics and adhesion strength, ten-point average roughness may more preferably be in a range from 0.1 to 1.5 µm, and further preferably in a range from 0.3 to 1.1 µm. These values of ten-point average roughness Rz can be measured by the method described in Examples below.

Thermocompression-Bonding of Thermoplastic Liquid Crystal Polymer Film and Metal Sheet The production method according to the present invention includes a thermocompression-bonding of a thermoplastic liquid crystal polymer film and a metal sheet, wherein the thermocompression-bonding includes introducing the thermoplastic liquid crystal polymer film and the metal sheet between a pair of heating rolls so as to laminate them with each other.

The pair of heating rolls include at least a metal elastic roll on the side that comes in contact with the thermoplastic liquid crystal polymer film. The metal elastic roll is an elastic roll having a metal surface, and said metal surface has an extremely smooth surface with ten-point average roughness Rz of 0.2 µm or less. The lower limit for ten-point average roughness Rz is not particularly provided and may be set to, for example, 0.01 µm or greater.

Since a metal elastic roll having such an extremely smooth surface comes into contact with a thermoplastic liquid crystal polymer film in the compression-bonding between a pair of heating rolls, it is possible to transfer the metal surface shape of the metal elastic roll with a specific surface roughness onto the thermoplastic liquid crystal polymer film, while suppressing uneven compression thanks to surface-attaching property of the metal elastic roll. Consequently, it is possible to impart a specific glossiness to the surface of the thermoplastic liquid crystal polymer film of the metal clad laminate.

In particular, since the metal surface of the metal elastic roll enhances heat dissipation in roll surface temperature, deterioration in releasability of the thermoplastic liquid crystal polymer film from the roll can be avoided even when lamination is performed at high temperature for an extended period of time. As a result, inferior appearance caused by deteriorated release such as wrinkles on the surface of the thermoplastic liquid crystal polymer film can be avoided.

The metal elastic roll is not particularly limited to a specific one as long as it is an elastic roll having a predetermined smooth metal surface. To improve transfer performance, the metal elastic roll may preferably be a metal elastic roll comprising a roll of heat-resistant rubber and a metal surface layer formed around the roll (hereinafter, referred to as metal-rubber roll).

From the viewpoint of improvement in lamination performance during thermocompression-bonding, the rubber roll part in the metal-rubber roll may have a rubber hardness of about 70 to 100, preferably about 75 to 90. Rubber hardness used herein refers to a value obtained by a test using a type A spring hardness testing machine in accordance with JIS K 6301. Rubber having a rubber hardness of 70 or higher can be obtained by adding a vulcanizing agent or a vulcanization accelerator such as alkaline substance into natural rubber or synthetic rubber, such as silicone rubber and fluororubber.

The metal surface layer of the metal-rubber roll may have a thickness, for example, from 100 to 1000 µm, preferably from 150 to 800 µm, and more preferably from 200 to 500 µm. The metal surface layer may be a cylindrical plated layer or a metal plate processed into a cylindrical shape, depending on thickness and/or material, which is formed of a metal with excellent heat resistance and rigidity (for example, nickel, stainless steel).

In the pair of heating rolls, the roll on the side that comes into contact with the metal sheet may be suitably selected depending on a heating means. As such a heating means, there may be described, for example, a thermal treatment apparatus or a thermal method using a hot-air type heat treatment furnace, a hot air circulation dryer, a hot roll (heating roll), a ceramic heater, or IR (far infrared), as well as a thermal treatment apparatus or a thermal method using these in combination.

For example, where the heating means is an externally heating type, as the heating rolls, mention may be made of a metal roll, a metal elastic roll, and a heat-resistant rubber roll. Where the heating means is an internally heating type, a metal roll (metal heating roll) of the internal heating type may preferably be used.

During lamination with a pair of heating rolls, lamination temperature may suitably be selected in accordance with a melting point (Tm) of a thermoplastic liquid crystal polymer film. For example, the lamination temperature may be in a range from a temperature lower than a melting point (Tm) by 40° C. to a temperature lower than the melting point by 5° C., that is, from (Tm−40)° C. to (Tm−5)° C., preferably in a range from (Tm−35)° C. to (Tm−7)° C., more preferably in a range from (Tm−30)° C. to (Tm−10)° C.

To impart highly glossy texture to the thermoplastic liquid crystal polymer film, lamination pressure using a pair of heating rolls may be, for example, about 15 to 70 kg/cm$^2$, preferably about 20 to 60 kg/cm$^2$, preferably about 25 to 55 kg/cm$^2$ as surface pressure.

If necessary, thermal treatment may further be performed to the single-sided metal clad laminate including the thermoplastic liquid crystal polymer film and the metal sheet bonded by the heating rolls so as to improve interlayer adhesion between them.

As a heating processing means for the thermal treatment, there may be mentioned, for example, a thermal treatment apparatus using a hot-air type thermal treatment furnace, a hot air circulation dryer, a hot roll, a ceramic heater, or IR (far infrared) or a method using these in combination. Also, in order to prevent oxidation of the surface of the metal sheet, it is preferable to use heated nitrogen gas to perform heating treatment in an inert atmosphere with an oxygen concentration of 0.1% or lower. The thermal treatment may be performed in the condition that the single-sided metal clad laminate is placed with tension or without tension, and may be preferably performed in the condition without tension.

Where a thermal treatment temperature is denoted by Ta (° C.), the thermal treatment temperature Ta (° C.) may be, for example, a temperature higher than the melting point Tm (° C.) of the thermoplastic liquid crystal polymer film (Tm<Ta), preferably a temperature higher than Tm (° C.) by 1° C. or greater but by less than 50° C. (Tm+1≤Ta<Tm+50), more preferably a temperature higher than Tm by 1° C. or greater but by 30° C. or less (Tm+1≤Ta≤Tm+30), further preferably a temperature higher than Tm by 2° C. or greater but by 20° C. or less (Tm+2≤Ta≤Tm+20).

In addition, thermal treatment time at a predetermined thermal treatment temperature Ta (for example, in the case of roll-to-roll processing, the thermal treatment time is a time during which an arbitrary point passes through to be subjected to the thermal treatment temperature Ta) may preferably be from 1 second to 10 minutes, more preferably from 5 seconds to 8 minutes, further preferably from 8 seconds to 5 minutes, and particularly preferably from 8 seconds to 3 minutes.

Metal Vapor Deposition

The production method according to the present invention may further include a metal vapor deposition step in which a metal is vapor-deposited to the surface of the thermoplastic liquid crystal polymer film of the single-sided metal clad laminate. To improve production efficiency, preferably, the metal vapor deposition step may also be performed via a roll-to-roll processing. In that case, the single-sided metal clad laminate is introduced to a heating roll used in vapor deposition (vapor deposition-applied heating roll) such that the metal sheet surface of the single-sided metal clad laminate comes into contact with the vapor deposition-applied heating roll in a chamber for vapor deposition, so as to form a metal vapor deposition layer onto the surface of the thermoplastic liquid crystal polymer film placed on the vapor deposition-applied heating roll.

Metal vapor deposition may, for example, be performed by vacuum vapor deposition, and examples of heating means for this process may include, for example, resistance heating, electron beam heating, and high-frequency heating. For example, where resistance heating is used, a vapor deposition boat (formed of a resistor such as tungsten and molybdenum) containing a vapor deposition source (for example, a metal such as copper, gold, silver, nickel, aluminum, and stainless steel, preferably copper, and particularly preferably copper with a purity of 99% or higher) is placed inside a vapor deposition chamber in a vacuum vapor deposition apparatus. Thereafter, the vapor deposition boat is heated by making current to be passed through so that the evaporated metal is deposited onto the surface of the thermoplastic liquid crystal polymer film. In this way, a metal vapor deposition layer can be formed on the surface of the thermoplastic liquid crystal polymer film of the single-sided metal clad laminate.

Where electron beam heating is employed, a vapor deposition source is placed in a crucible, and an electron beam is irradiated onto the crucible to heat the vapor deposition source under vacuum atmosphere so as to vapor-deposit the metal onto the surface of the thermoplastic liquid crystal polymer film. In this way, a metal vapor deposition layer can be formed on the surface of the thermoplastic liquid crystal polymer film of the single-sided metal clad laminate to produce a double-sided metal clad laminate.

In the formation of the metal vapor deposition layer, in order to improve adhesion between the thermoplastic liquid crystal polymer film and the metal vapor deposition layer, the vapor deposition-applied heating roll preferably has a surface temperature of equal to or higher than a heat deflection temperature (Tdef) of the thermoplastic liquid crystal polymer film but equal to or lower than the melting point (Tm) of the thermoplastic liquid crystal polymer film. For example, the vapor deposition-applied heating roll may have a surface temperature, in relation to the melting point (Tm) of the thermoplastic liquid crystal polymer film, from (Tm−65)° C. to (Tm−0.5)° C., preferably from (Tm−55)° C. to (Tm−1)° C., and more preferably from (Tm−45)° C. to (Tm−1.5° C.). Vapor deposition performed at a temperature equal to or higher than a heat deflection temperature of a thermoplastic liquid crystal polymer film makes it possible to form a metal vapor deposition layer having good adhesion even to a thermoplastic liquid crystal polymer film having an extremely smooth surface presumably because vapor depositing particles (particles scattering upon vapor deposition) may penetrate into the film that is softened by heating.

In the present embodiment, a vapor deposition rate may preferably be set to 1 nm/s or higher but 5 nm/s or lower to improve productivity in the roll-to-roll processing.

In the present embodiment, a moving speed of the thermoplastic liquid crystal polymer film 2 in the roll-to-roll processing may preferably be set to 0.1 m/min to 5 m/min.

Metal Clad Laminate

A metal clad laminate according to an aspect of the present invention at least includes a thermoplastic liquid crystal polymer film and a metal sheet laminated, wherein a surface of the thermoplastic liquid crystal polymer film which is opposite from a bonding surface to the metal sheet has glossiness (20°) in accordance with JIS Z 8741 of 55 or higher. In the case where the metal clad laminate includes a metal vapor deposition layer on the surface of the thermoplastic liquid crystal polymer film which has the glossiness, the glossiness of the surface of the thermoplastic liquid crystal polymer film may be checked by etching removal of the metal vapor deposition layer.

The metal clad laminate can have glossiness (20°) in accordance with JIS Z 8741-1997 of 55 or higher on its surface because the surface of the thermoplastic liquid crystal polymer film is extremely smooth thanks to a predetermined production method. The upper limit for the glossiness (20°) on the surface of the thermoplastic liquid crystal polymer film is not particularly provided and may be set to, typically, 200 or lower.

The inventors have found that in a thermoplastic liquid crystal polymer film having non-metallic luster, the surface condition of the film that affects transmission properties can be accurately evaluated using glossiness, when a precise circuit pattern such as fine pitches is to be formed. That is, although surface roughness that is measured in a microscopic range cannot be used to accurately evaluate overall smoothness of a film surface for a thermoplastic liquid crystal polymer film, glossiness that is measured in a macroscopic range makes it possible to evaluate the overall smoothness of the film surface. Accordingly, it is considered that glossiness may be used as an evaluation criterion for transmission properties.

The surface of the thermoplastic liquid crystal polymer film may preferably have a glossiness (20°) of 60 or higher (for example, 60 to 120), and more preferably 65 or higher (for example, 65 to 100). These values of glossiness (20°) can be measured by the method described in Examples below.

Moreover, since the glossiness (20°) of the thermoplastic liquid crystal polymer film surface hardly decreases even when continuous operation is performed via roll-to-roll processing, the surface of the thermoplastic liquid crystal polymer film may have a glossiness retention rate, for example, of 95% or higher (for example, 95 to 105%), preferably 97% or higher (for example, 95 to 103%) after continuous operation via the roll-to-roll processing for 60 minutes. It should be noted that the glossiness retention rate after continuous operation for 60 minutes can be calculated by the following formula:

Glossiness retention rate=(Glossiness after continuous operation for 60 minutes/Glossiness immediately after operation start)×100

In the formula, the "glossiness immediately after operation start" means glossiness of a thermoplastic liquid crystal polymer film surface in the laminate sample obtained immediately after starting operation via roll-to-roll processing, and the "glossiness after continuous operation for 60 minutes" means glossiness of a thermoplastic liquid crystal polymer film surface in the laminate sample obtained after continuous operation for 60 minutes.

In particular, a preferred aspect of the present invention makes it possible to form a single-sided metal clad laminate without causing inferior appearance caused by deteriorated release even using a thermoplastic liquid crystal polymer film that has a high melting point and has conventionally been difficult to manufacture via roll-to-roll processing. Such a film having a high melting point may have a melting point of, for example, 290° C. or higher (for example, 300° C. to 400° C.), preferably 315° C. to 380° C.

Thanks to such a smoothness of the surface of the thermoplastic liquid crystal polymer film, the double-sided metal clad laminate including a metal vapor deposition layer formed on the surface of the thermoplastic liquid crystal polymer can exhibit excellent transmission properties. The metal vapor deposition layer may have a thickness, for example, of from 0.05 µm to 1.0 µm, and more preferably from 0.1 µm to 0.8 µm.

The metal clad laminate according to the present invention makes it possible to effectively manufacture metal clad laminates of a large size as it is formed via a roll-to-roll processing, as opposed to a metal clad laminate formed via a batch press processing. For example, the metal clad laminate may have a length of 100 m or longer in the longitudinal direction.

Circuit Board

A circuit board according to one aspect of the present invention is a circuit board comprising a circuit surface (circuit layer) formed on the metal clad laminate. The circuit surface may be formed by a known process such as a subtractive process, an additive process, and a semi-additive process. The circuit (metal layer) may have a thickness, for example, from 10 to 14 µm, preferably from 11 to 13 µm.

The circuit surface may preferably be formed on the surface of the thermoplastic liquid crystal polymer film or in the surface of the metal vapor deposition layer. Alternatively, a metal plated layer may further be formed on the metal vapor deposition layer so as to form a circuit surface on the metal plated surface.

If necessary, into the circuit board, a through-hole(s) may be formed by different production methods that are known or commonly employed. In such a case, the circuit board may comprise a through-hole plated layer. The circuit (metal layer) with the through-hole plated layer may have a thickness, for example, from 20 to 40 µm, preferably from 25 to 35 µm.

Since the circuit board of the present invention is particularly excellent in transmission properties, it can be suitably used as, in particular, a high-frequency circuit board. Examples of the high-frequency circuits may include not only circuits that simply transmit only high-frequency signals, but also circuits that transmit high-frequency signals as well as signals other than high-frequency signals where both transmission lines are located on the same plane. The transmission lines to transmit signals other than high-frequency signals may include transmission lines for converting high-frequency signals to low-frequency signals to output the generated low-frequency signals to outside as well as transmission lines for supplying power supplied for driving parts adapted for high frequency.

EXAMPLES

Hereinafter, the present invention will be described in detail with reference to Examples, however the present invention is not limited to these Examples. Various physical properties discussed in the Examples and Comparative Examples were measured by the following procedures.

Glossiness

In accordance with JIS Z 8741, a sample was placed on a flat table and measured for glossiness (degree of gloss) of the sample at an incident angle of 20° by a gloss meter ("GC-1" produced by Suga Kikai Co. Ltd.). Calibration of the gloss meter was performed using an attached calibration plate.

Transmission Properties

Measurement of dielectric constant was performed by the resonant-perturbation method at a frequency of 10 GHz. A microwave network analyzer (produced by Agilent) was connected with a probe adapted for 40 to 67 GHz, and transmission loss was measured at 40 GHz and 60 GHz.

Surface Roughness

For surface roughness, ten-point average roughness (Rz) was measured by a contact surface roughness meter (produced by Mitutoyo Corporation, type: SJ-201) in accordance with JIS B0601:1994. Specifically, ten-point average roughness (Rz) is indicated by a value expressed in µm that is obtained by selecting a sampled reference length along the direction of the average line from a roughness curve, and determining sum of the average of the absolute values of the 5 highest peak points (convex top points) and the average of the absolute values of the 5 lowest valley points (concave bottom points) in the sampled section.

Melting Point

A melting point was determined from observation of thermal behaviors of a film sample using a differential scanning calorimeter. In other words, a prepared film was heated at a rate of 20° C./min to completely melt the film, and then the melt was rapidly cooled to 50° C. at a rate of 50° C./min and reheated at a rate of 20° C./min. A temperature at which an endothermic peak occurs during reheating was taken as a melting point of the thermoplastic liquid crystal polymer film.

Heat Deflection Temperature

A heat deflection temperature was determined from observation of thermal behaviors of a film sample using a thermomechanical analyzer. In other words, a prepared film was cut into test pieces each having a width of 5 mm and a length of 20 mm. Then, an amount of thermal expansion in a length direction of a test piece was measured with a chuck spacing of 15 mm in a condition of a tensile load of 0.01 N and a heating rate of 10° C./min. A deflection temperature of the test piece was taken as a heat deflection temperature of the thermoplastic liquid crystal polymer film.

Example 1

(1) Preparation of Thermoplastic Liquid Crystal Polymer Film

A thermotropic liquid crystal polyester (thermotropic LCP) including 6-hydroxy-2-naphthoic acid units (27 mol %) and p-hydroxybenzoic acid units (73 mol %) was heated and kneaded using a single-screw extruder at a temperature from 280 to 300° C., and then was extruded from an inflation die with a diameter of 40 mm and a slit interval of 0.6 mm to obtain a thermoplastic liquid crystal polymer film with a thickness of 50 μm. The thermoplastic liquid crystal polymer film had a melting point Tm of 282° C. and a heat deflection temperature Tdef of 230° C.

(2) Preparation of Single-Sided Metal Clad Laminate

Preparation of a single-sided metal clad laminate will be explained with referring to FIG. 1. The thermoplastic liquid crystal polymer film prepared in the previous step (1) and a rolled copper foil (produced by JX Nippon Mining & Metals Corporation under a name of BHYX-HA-V2, Rz: 0.9 μm) with a thickness of 12 μm were prepared as a thermoplastic liquid crystal polymer film 2 and a metal sheet 6, respectively. To a continuous hot roll press apparatus 10 were attached a metal elastic roll 8 and a metal heating roll 9 as a pair of heating rolls 7 for lamination. The thermoplastic liquid crystal polymer film 2 and the metal sheet 6 were introduced in such a way that the thermoplastic liquid crystal polymer film 2 came into contact with the metal elastic roll 8 and the metal sheet 6 came into contact with the metal heating roll 9. The thermoplastic liquid crystal polymer film 2 and the metal sheet 6 were thermocompression-bonded by the pair of heating rolls so as to form a single-sided metal clad laminate 19.

Here, the metal elastic roll 8 was a heat-resistant rubber roll with a hardness of 90 degree provided with a metal band having a thickness of 380 μm as the outer perimetry layer. The metal surface of the metal elastic roll had a ten-point surface roughness Rz of 0.2 μm or lower. The metal heating roll 9 had a surface temperature of 270° C. The pressure applied to the thermoplastic liquid crystal polymer film and the copper foil between the heat-resistant rubber roll and the metal heating roll was 40 kg/cm² when converted into a surface pressure. The lamination was carried out at a lamination speed of 3 m/min. In this condition, the thermoplastic liquid crystal polymer film was introduced toward the heat-resistant rubber roll and came into contact with the heat-resistant rubber roll surface and then moved with attaching to the heat-resistant rubber roll surface. Thereafter, the moving thermoplastic liquid crystal polymer film came into contact with the copper foil and was bonded to the copper foil so as to form a laminated plate.

Further, in order to improve interlayer adhesion between the thermoplastic liquid crystal polymer film and the metal sheet in the laminated plate, a nip roll was subsequently used to release winding tension in the line, and thermal treatment using IR was performed to the prepared laminated plate.

The thermal treatment was performed in a thermal treatment apparatus by setting the condition that in a thermal treatment furnace in which temperature zone was gradually increased from 150° C. into a temperature of $(Tm+5)°$ C. (Tm: film melting point) an arbitrary point in the laminated plate passes through the temperature of $(Tm+5)°$ C. for 10 seconds as a thermal treatment time (i.e., time for an arbitrary point in the laminated plate to pass through a predetermined thermal treatment temperature).

After 60 minutes from starting operation, thus obtained single-sided metal clad laminate was observed by visual inspection to evaluate the surface condition of the thermoplastic liquid crystal polymer film surface, and glossiness on the surface of the thermoplastic liquid crystal polymer film was determined. The results are shown in Table 7.

(3) Formation of Copper Vapor Deposition Layer

Formation of a copper vapor deposition layer will be explained with referring to FIG. 2. A roll-to-roll processing using a vacuum vapor deposition apparatus (produced by ROCK GIKEN KOGYO Co., Ltd. under a name of RVC-W-300) was employed to form a copper vapor deposition layer (thickness: 0.3 μm) on the surface of the liquid crystal polymer film 2 of the above single-sided metal clad laminate 19.

More specifically, after the single-sided metal clad laminate 19 was set on the loader side, an open window was completely closed to perform evacuation with allowing the vapor deposition-applied heating roll 13 to have a temperature of 100° C.

Next, copper ingots were prepared, and copper pellets were added so as to make the total amount of copper to be 450 g. It should be noted that the copper pellets were cleaned with an aqueous solution of sodium persulfate and then rinsed with distilled water as a pretreatment.

Next, after confirming that vacuum within a chamber for vapor deposition had reached $7\times10^{-3}$ Pa, the vapor deposition-applied heating roll 13 was set to $(Tm-15)°$ C. (Tm: film melting point). Thereafter, by increasing output of EMI (emission current value) of an electron gun 18, copper in a crucible 17 was molten. Note that, in this process, the EMI output value was adjusted to attain the vapor deposition rate of 2.7 nm/s.

Next, when it was confirmed that the temperature of the vapor deposition-applied heating roll 13 reached the setting temperature $(Tm-15)°$ C. and that vacuum within the chamber for vapor deposition reached $5\times10^{-3}$ Pa or less, vapor deposition process for copper was performed with a feed rate of the single-sided metal clad laminate 19 set to 0.5 m/min to form a copper vapor deposition layer having a thickness of 0.3 μm and obtain a double-sided metal clad laminate 21.

(4) Formation of Microstrip Circuit

The obtained double-sided metal clad laminate 21 was used to form a 50-Ω transmission line (microstrip line) to transmit electromagnetic waves so as to obtain a plate-shaped dielectric substrate having linear conductor on the front side and conductor foil on the rear side.

More concretely, the metal vapor deposition surface of the double-sided metal clad laminate 21 was used as a seed layer to form a resist pattern thereon and the electrolytic copper plating was performed to grow circuit lines. Thereafter, the resist was removed by etching the seed layer between circuit lines to form a circuit pattern having a thickness of 12 μm. Further, through-hole plating was performed to prepare a microstrip circuit board having a circuit thickness of 30 μm, and transmission properties of the board was determined. The results are shown in Table 7.

Example 2

(1) Preparation of Thermoplastic Liquid Crystal Polymer Film

A thermotropic liquid crystal polyester including 6-hydroxy-2-naphthoic acid units (20 mol %) and p-hydroxybenzoic acid units (80 mol %) was heated and kneaded using a single-screw extruder at a temperature of 350° C., and then was extruded from an inflation die with a diameter of 40 mm and a slit interval of 0.6 mm to obtain a thermoplastic liquid crystal polymer film with a thickness of 50 μm. The thermoplastic liquid crystal polymer film had a melting point Tm of 325° C. and a heat deflection temperature Tdef of 310° C.

(2) A single-sided metal clad laminate was prepared in the same manner as Example 1 that the thermoplastic liquid crystal polymer film prepared in the previous step (1) was used as a thermoplastic liquid crystal polymer film and the surface temperature of the metal heating roll 5 was set to 300° C. Then, a double-sided metal clad laminate and a microstrip circuit board were prepared in the same manner as Example 1, except that the setting temperature of the vapor deposition-applied heating roll 13 was set to (Tm−15)° C. (Tm: film melting point). Table 7 shows various physical properties.

Examples 3 and 4

Double-sided metal clad laminates and microstrip circuit boards in Examples 3 and 4 were respectively prepared in the same manner as Examples 1 and 2, except that single-sided metal clad laminates manufactured immediately after staring operation were used for the single-sided metal clad laminates of Examples 1 and 2, instead of the single-sided metal clad laminates obtained after 60 minutes from starting operation. Table 7 shows various physical properties.

Comparative Example 1

A single-sided metal clad laminate was prepared in the same manner as Example 1, except that a heat-resistant rubber roll [resin-coated metal roll (manufactured by YURI ROLL MACHINE CO., LTD. under a name of Super-Tempex, resin thickness: 1.7 cm), diameter: 40 cm] was used instead of the metal elastic roll. Thereafter, a double-sided metal clad laminate and a microstrip circuit board were obtained in the same manner as Example 1. Table 7 shows various physical properties.

Comparative Example 2

A single-sided metal clad laminate was prepared in the same manner as Example 2, except that a heat-resistant rubber roll [resin-coated metal roll (manufactured by YURI ROLL MACHINE CO., LTD. under a name of Super-Tempex, resin thickness: 1.7 cm), diameter: 40 cm] was used instead of the metal elastic roll. Thereafter, a double-sided metal clad laminate and a microstrip circuit board were obtained in the same manner as Example 2. Table 7 shows various physical properties.

Comparative Examples 3 and 4

Double-sided metal clad laminates and microstrip circuit boards in Comparative Examples 3 and 4 were respectively prepared in the same manner as Comparative Examples 1 and 2, except that single-sided metal clad laminates manufactured immediately after staring operation were used for the single-sided metal clad laminates of Comparative Examples 1 and 2, instead of the single-sided metal clad laminates obtained after 60 minutes from starting operation. Table 7 shows various physical properties.

TABLE 7

| | LCP film Melting point (° C.) | Heating roll Type | Heating roll Lamination Temperature (° C.) | Surface condition after 60 min of operation | LCP surface glossiness 20° | Transmission properties by microstrip circuit 40 GH (dB/10 cm) | Transmission properties by microstrip circuit 60 GH (dB/10 cm) |
|---|---|---|---|---|---|---|---|
| Ex. 1 | 282 | Metal elastic roll | 270 | No wrinkle after release | 70 | −5.7 | −9.4 |
| Ex. 2 | 325 | Metal elastic roll | 300 | No wrinkle after release | 65 | −5.9 | −9.3 |
| Ex. 3* | 282 | Metal elastic roll | 270 | — | 71 | −5.7 | −9.4 |
| Ex. 4* | 325 | Metal elastic roll | 300 | — | 64 | −5.9 | −9.3 |
| Com. Ex. 1 | 282 | Rubber roll | 260 | With wrinkles after release | 37 | Unmeasurable due to many wrinkles | Unmeasurable due to many wrinkles |
| Com. Ex. 2 | 325 | Rubber roll | 300 | With wrinkles after release | 46 | Unmeasurable due to many wrinkles | Unmeasurable due to many wrinkles |
| Com. Ex. 3* | 282 | Rubber roll | 260 | — | 48 | −7.2 | −10.2 |
| Com. Ex. 4* | 325 | Rubber roll | 300 | — | 50 | −7.1 | −10.1 |

*: Samples were obtained immediately after starting operation.

As shown in Table 7, both Examples 1 and 2 do not have wrinkles on the liquid crystal polymer film surfaces to keep good surface conditions even after continuous operation for 60 minutes. Further, glossiness of Examples 1 and 2, even after continuous operation for an extended period of time, is comparable with that in Examples 3 and 4 obtained from the metal clad laminate immediately after operation start to show high glossiness of the liquid crystal polymer film surfaces. In Examples 1 and 2, glossiness retention rates after continuous operation for 60 minutes were 98.5% and 101%, respectively.

Moreover, such high glossiness enables for the microstrip circuit boards obtained in Examples 1 to 4 to have smaller transmission loss at both 40 GHz and 60 GHz, compared with those of Comparative Examples.

On the contrary, in Comparative Examples 1 and 2, adhesion of the liquid crystal polymer films to the heat-resistant rubber rolls increased along continuous operation, and noticeable occurrence of wrinkles after release was observed on the surfaces of the liquid crystal polymer films after 60 minutes. Even in the parts without wrinkles, these parts were less glossy, and the glossiness values of the liquid crystal polymer film surfaces in Comparative Examples 1 and 2 are lower, compared with those in Examples 1 and 2.

Further, as evident from Comparative Examples 3 and 4 using the heat-resistant rubber roll, glossiness values of the liquid crystal polymer film surfaces are lower even immediately after starting operation, compared with those in Examples 1 and 2, because of the transferring of small lines formed on the rubber roll surface. Also, transmission losses of both Comparative Examples 3 and 4 are deteriorated, compared with the Examples. In addition, the glossiness retention rates in Comparative Examples 1 and 2 are 77% and 92%, respectively, after continuous operation for 60 minutes to show significantly decreased glossiness when compared with that of Examples 1 and 2.

INDUSTRIAL APPLICABILITY

According to the present invention, a metal clad laminate having a liquid crystal polymer film surface that achieves an unconventionally glossy surface can be obtained. In addition, use of such a metal clad laminate makes it possible to provide a circuit board having excellent transmission properties.

As described above, the present invention has been described as to the preferred embodiments thereof with reference to the figures, but one skilled in the art would easily make various changes or modifications in view of the present description, without departing from the spirit or scope of the present invention. Accordingly, such changes and modifications are construed as within the scope of the invention as defined from the scope of the claims.

REFERENCE NUMERALS

2 . . . thermoplastic liquid crystal polymer film
6 . . . metal sheet
7 . . . pair of heating rolls
8 . . . metal elastic roll
9 . . . metal heating roll
10 . . . continuous hot press apparatus
13 . . . vapor deposition-applied heating roll
19 . . . single-sided metal clad laminate
21 . . . double-sided metal clad laminate

What is claimed is:

1. A metal clad laminate at least comprising a thermoplastic liquid crystal polymer film and a metallic foil bonded to each other, wherein
   the thermoplastic liquid crystal polymer film has a surface with a glossiness (20°) of 55 or higher in accordance with JIS Z 8741 on a side of the liquid crystal polymer film opposite to the metallic foil, and
   the metallic foil has a ten-point average roughness Rz of from 0.1 μm to 2.0 μm on a surface of the metallic foil in contact with the liquid crystal polymer film.

2. The metal clad laminate according to claim 1, wherein the thermoplastic liquid crystal polymer film has a melting point of 290° C. or higher.

3. The metal clad laminate according to claim 1, further comprising a metal vapor deposition layer formed on a surface of the thermoplastic liquid crystal polymer film opposite to the metallic foil.

4. The metal clad laminate according to claim 1, wherein the metal clad laminate has a length of 100 m or longer in a longitudinal direction.

5. The metal clad laminate according to claim 1, wherein the glossiness (20°) is 60 or higher.

6. The metal clad laminate according to claim 1, wherein the thermoplastic liquid crystal polymer film comprises a thermoplastic liquid crystal polymer capable of forming an optically anisotropic melt phase.

7. A circuit board comprising the metal clad laminate recited in claim 1 and a circuit pattern formed on the metal clad laminate.

8. The circuit board according to claim 7, wherein the circuit pattern is formed on a surface of the thermoplastic liquid crystal polymer film or a surface of a metal vapor deposition layer formed on a surface of the thermoplastic liquid crystal polymer film opposite to the metallic foil.

9. A method for producing a metal clad laminate of claim 1 via a roll-to-roll processing, the method at least comprising:
   providing a thermoplastic liquid crystal polymer film capable of forming an optically anisotropic melt phase and the metallic foil; and
   introducing the thermoplastic liquid crystal polymer film and the metallic foil between a pair of heating rolls so as to laminate the thermoplastic liquid crystal polymer film and the metallic foil between the pair of heating roll,
   wherein the pair of heating rolls at least comprises a metal elastic roll on a side that comes into contact with the thermoplastic liquid crystal polymer film, and
   the metal elastic roll surface has a ten-point average roughness Rz of 0.2 μm or lower to give the glossiness (20°) of 55 or higher in accordance with JIS Z 8741 on the side of the liquid crystal polymer film opposite to the metallic foil.

10. The method for producing a metal clad laminate according to claim 9, wherein the pair of heating rolls comprise a metal roll and a metal elastic roll.

11. The method for producing a metal clad laminate according to claim 10, wherein the metal roll is an internal heating metal roll.

12. The method for producing a metal clad laminate according to claim 9, wherein the metal elastic roll is constituted from a roll of heat-resistant rubber and a metal surface layer formed around the roll.

13. The method for producing a metal clad laminate according to claim 12, wherein the heat-resistant rubber has a hardness from 70 to 100, and the metal surface layer has a thickness from 100 µm to 1000 µm.

14. A metal clad laminate at least comprising a thermoplastic liquid crystal polymer film and a metallic foil bonded to each other, and further comprising a metal vapor deposition layer on a surface of the thermoplastic liquid crystal polymer film opposite to the metallic foil, wherein
   the thermoplastic liquid crystal polymer film is capable of forming an optically anisotropic melt phase and has a surface with a glossiness (20°) of 55 or higher in accordance with JIS Z 8741 on a side of the liquid crystal polymer film opposite to the metallic foil;
   the metallic foil has a ten-point average roughness Rz of from 0.1 µm to 2.0 µm on a surface of the metallic foil in contact with the liquid crystal polymer film; and
   the metal deposition layer has a thickness of from 0.05 µm to 1.0 µm.

* * * * *